United States Patent
Wollenweber et al.

(10) Patent No.: US 8,969,829 B2
(45) Date of Patent: Mar. 3, 2015

(54) METHOD AND APPARATUS FOR ALIGNING A MULTI-MODALITY IMAGING SYSTEM

(76) Inventors: Scott David Wollenweber, Waukesha, WI (US); Bruce Collick, Waukesha, WI (US); Anton Linz, Waukesha, WI (US); Charles Stearns, Milwaukee, WI (US); William Peterson, Sussex, WI (US); Laura Armstrong, Waukesha, WI (US)

( * ) Notice: Subject to any disclaimer, the term of this patent is extended or adjusted under 35 U.S.C. 154(b) by 224 days.

(21) Appl. No.: 13/435,792

(22) Filed: Mar. 30, 2012

(65) Prior Publication Data

US 2013/0256559 A1   Oct. 3, 2013

(51) Int. Cl.
*G01N 21/00* (2006.01)

(52) U.S. Cl.
USPC ...... 250/453.11; 600/411; 324/309; 324/318; 378/162

(58) Field of Classification Search
CPC ............. G01R 33/481; G01R 33/3678; G01R 33/385; A61B 5/055; A61B 6/037
USPC ........... 600/411; 382/131; 324/307, 309, 318; 250/453.11
See application file for complete search history.

(56) References Cited

U.S. PATENT DOCUMENTS

| | | | |
|---|---|---|---|
| 4,719,406 A | 1/1988 | Schaefer et al. | |
| 7,103,233 B2 * | 9/2006 | Stearns | 382/289 |
| 8,077,943 B2 | 12/2011 | Williams et al. | |
| 8,188,736 B2 * | 5/2012 | Schulz et al. | 324/309 |
| 2001/0004395 A1 * | 6/2001 | McCrory et al. | 378/162 |
| 2009/0226066 A1 * | 9/2009 | Williams et al. | 382/131 |
| 2009/0326362 A1 * | 12/2009 | Carlse et al. | 600/411 |
| 2010/0033186 A1 * | 2/2010 | Overweg et al. | 324/318 |
| 2012/0095321 A1 * | 4/2012 | Bak | 600/411 |
| 2012/0172709 A1 * | 7/2012 | Nalcioglu et al. | 600/411 |
| 2012/0241631 A1 * | 9/2012 | Overweg et al. | 250/363.03 |
| 2013/0006091 A1 * | 1/2013 | Manjeshwar et al. | 600/411 |

* cited by examiner

*Primary Examiner* — Baisakhi Roy
(74) *Attorney, Agent, or Firm* — Dean D. Small; The Small Patent Law Group

(57) ABSTRACT

A target object for aligning a multi-modality imaging system includes a body having a cavity therein, a first imaging source being disposed within the cavity, the first imaging source including a body having a cavity defined therein and an emission responsive material disposed within the first imaging source cavity, the first imaging source having a first shape, and a second imaging source being disposed within the cavity, the second imaging source including a body having a cavity defined therein and a magnetic resonance responsive material disposed within the second imaging source cavity, the second imaging source having a second shape that is different than the first shape. A method of aligning a multi-modality imaging system is also provided.

20 Claims, 9 Drawing Sheets

METHOD AND APPARATUS FOR ALIGNING A MULTI-MODALITY IMAGING SYSTEM

BACKGROUND OF THE INVENTION

The subject matter disclosed herein relates generally to imaging systems capable of operation in multiple modalities, and more particularly to an apparatus and method for aligning a multi-modality imaging system.

Multi-modality (also referred to herein as multi-modal) imaging systems are capable of scanning using different modalities, such as, for example, but not limited to, Positron Emission Tomography (PET) and Magnetic Resonance Imaging (MRI). The difference between multi-mode and multi-modality is that in multi-mode systems the same hardware is utilized to perform scans in different modes (e.g., a radiation source and a radiation detector is used in both a flouro mode and a tomosynthesis mode). In a multi-modal system, although some of the same hardware is utilized to perform different scans (e.g., an image produced by PET is processed and displayed respectively, by the same computer and display, as an image produced by MRI), the data acquisition systems (also referred to a modality units) are different. For example, on a PET/MRI system, a radiopharmaceutical is typically employed in tandem with a PET camera to acquire PET data and a radio frequency (RF) coil is used to acquire MRI data.

In multi-modality systems, for example, an integrated PET/MRI system, the PET data and MRI data should be inherently registered with one another. Since the patient lies still on the same table during the PET and MRI portions of the acquisition, the patient should be in a consistent position and orientation during the two acquisitions, greatly simplifying the process of correlating and fusing the PET and MRI images. Inherent registration of the PET images and MRI images assumes a known alignment of the PET and MRI coordinate systems, consisting of at least a known spatial transformation between the two coordinate systems. Misalignment of the coordinate systems can result in a misregistration of the images between the two imaging modes.

BRIEF DESCRIPTION OF THE INVENTION

In one embodiment, a target object for aligning a multi-modality imaging system is provided. The target object includes a body having a cavity therein, a first imaging source being disposed within the cavity, the first imaging source including a body having a cavity defined therein and an emission responsive material disposed within the first imaging source cavity, the first imaging source having a first shape, and a second imaging source being disposed within the cavity, the second imaging source including a body having a cavity defined therein and a magnetic resonance responsive material disposed within the second imaging source cavity, the second imaging source having a second shape that is different than the first shape.

In another embodiment, an alignment object for aligning a multi-modality imaging system is provided. The alignment object includes a body and a plurality of target objects installed in the body. At least one of the target objects includes a first imaging source being disposed within the cavity, the first imaging source including a body having a cavity defined therein and an emission responsive material disposed within the first imaging source cavity, the first imaging source having a first shape, and a second imaging source being disposed within the cavity, the second imaging source including a body having a cavity defined therein and a magnetic resonance responsive material disposed within the second imaging source cavity, the second imaging source having a second shape that is different than the first shape.

In a further embodiment, a method of aligning a multi-modality imaging system is provided. The method includes imaging a plurality of target objects with the first modality unit to generate an emission image data set. At least one of the target objects includes a body having a cavity therein, a first imaging source being disposed within the cavity, the first imaging source including a body having a cavity defined therein and an emission responsive material disposed within the first imaging source cavity, the first imaging source having a first shape, and a second imaging source being disposed within the cavity, the second imaging source including a body having a cavity defined therein and a magnetic resonance responsive material disposed within the second imaging source cavity, the second imaging source having a second shape that is different than the first shape. The method further includes determining a location of the target objects in the emission image data set to produce emission target object location coordinates, calculating a positional alignment vector for each target object based on the emission target object location coordinates, and aligning the multi-modality imaging system based on the positional alignment vectors.

DETAILED DESCRIPTION OF THE INVENTION

Figure 1:
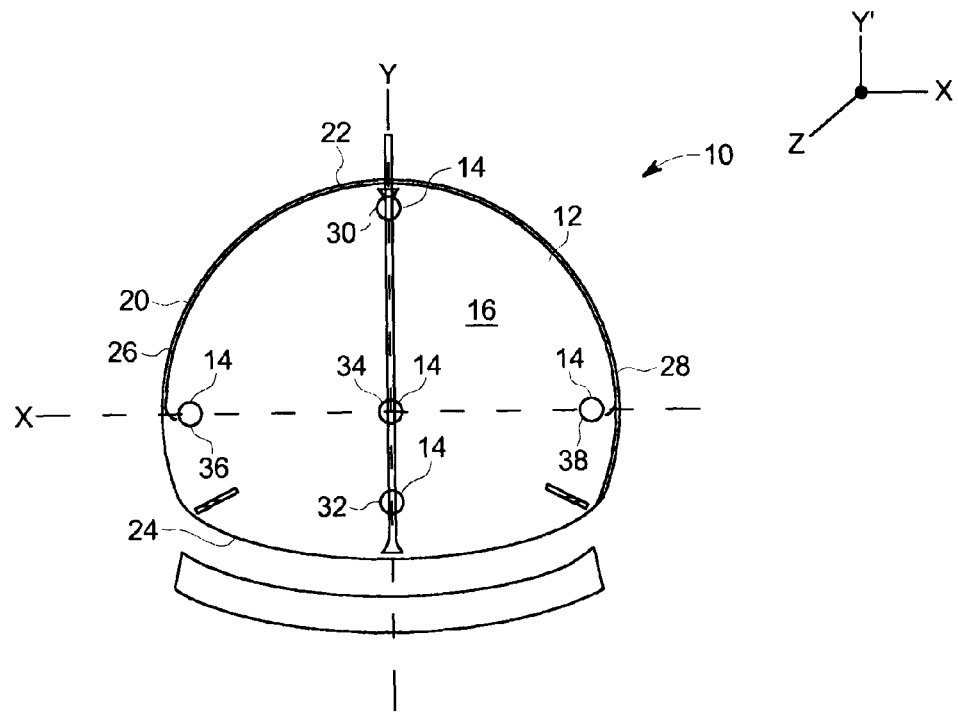
FIG. 1 is an end view of an exemplary alignment object formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Described herein are various embodiments for aligning a multi-modality imaging system, which in some embodiments is a dual-modality imaging system. Various embodiments utilize an alignment object that includes at least two sources to facilitate aligning the two imaging modalities that form the dual-modality imaging system. The alignment object is reconfigurable to enable the alignment object to be utilized with various imaging systems.

Figure 2:
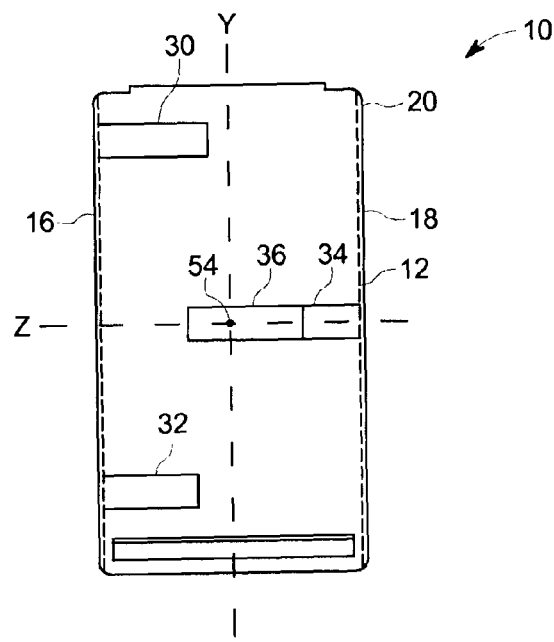
FIG. 2 is a side view of the exemplary alignment object shown in FIG. 1 formed in accordance with various embodiments.
Figure 3:
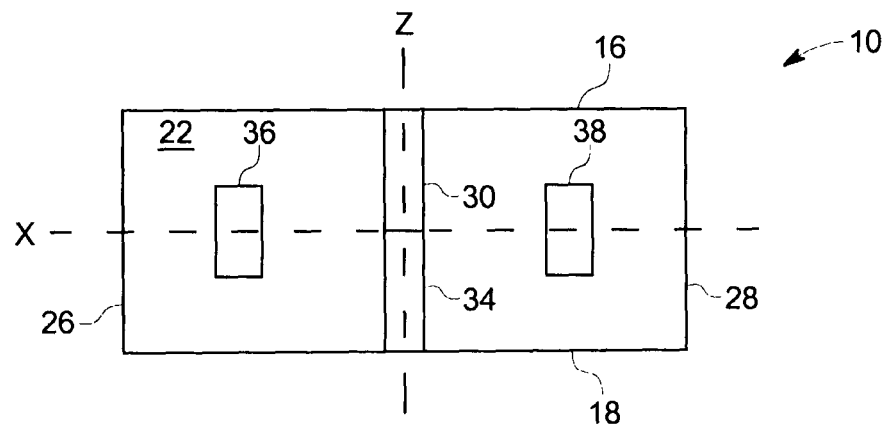
FIG. 3 is a top view of the exemplary alignment object shown in FIG. 1.
Figure 4:
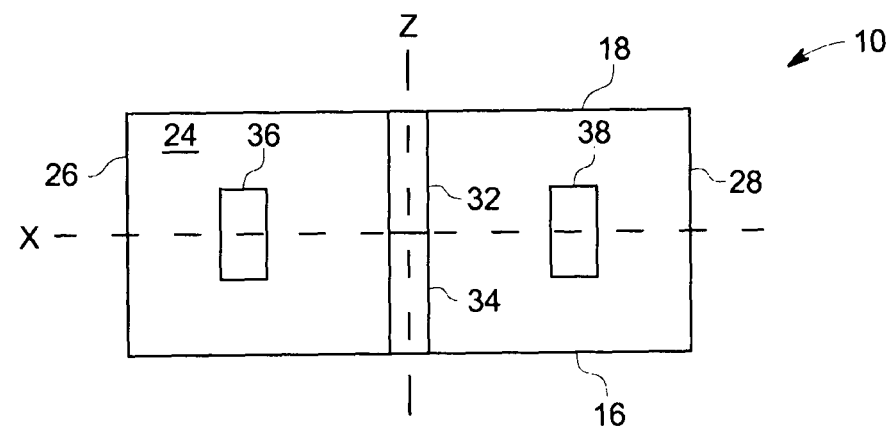
FIG. 4 is a bottom view of the exemplary alignment object shown in FIG. 1.
Figure 9:
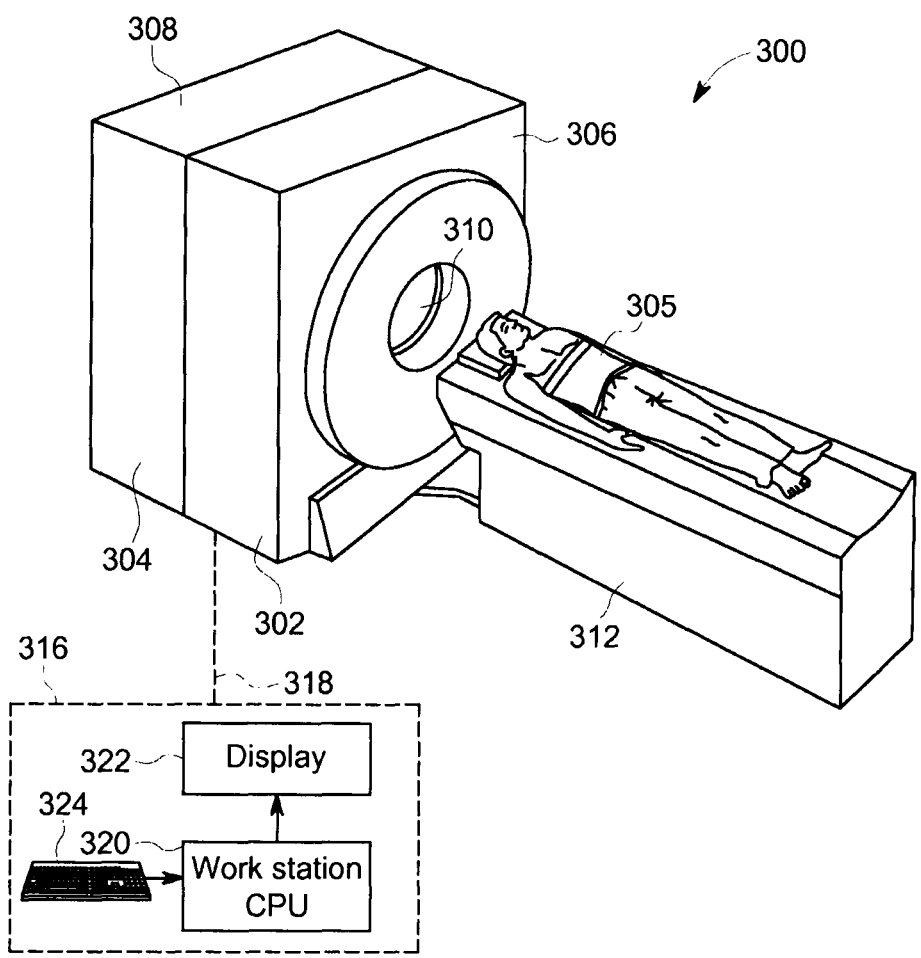
FIG. 9 is perspective view of a multi-modality imaging system formed in accordance with various embodiments.

FIG. 1 is an end view of an exemplary alignment object 10 that may be used to align an exemplary multi-modality imaging system, such as the multi-modality imaging system 300 shown in FIG. 9. FIG. 2 is a side view of the alignment object 10 shown in FIG. 1. FIG. 3 is a top view of the alignment object 10 shown in FIG. 1. FIG. 4 is a bottom view of the alignment object 10 shown in FIG. 1. In various embodiments, the multi-modality imaging system 300 includes a magnetic resonance imaging (MRI) system 302 and a positron emission tomography (PET) imaging system 304. It should be realized that other modalities may be utilized with the dual-modality imaging system 300. Other modalities include, for example, a computed tomography (CT) imaging system and a single photon emission computed tomography (SPECT) imaging system.

In the exemplary embodiment, the alignment object 10 includes a partially cylindrical body 12 and a plurality of target objects 14 embedded within the body 12. The body 12 has a first end 16 and an opposite second end 18. The alignment object 10 has an edge surface 20 that is disposed between the first end 16 and the second end 18. In various embodiments, the edge surface 20 is defined by a curved upper surface 22, a lower surface 24, a first side 26 and a second side 28. In various embodiments, the lower surface 24 may be formed as a curve that has a shape that is substantially similar to the curvature of an imaging table, such as an imaging table 312 shown in FIG. 9. In operation, the curvature of the body's lower surface 24 facilitates limiting the movement of the alignment object 10 when placed on the imaging table 312. In the exemplary embodiment, the body 12 is fabricated from a material that does not produce significant signal loss for either modality, such as attenuation for PET, and hence is made from a foam such as polyurethane material, for example. Specifically, the body 12 may be fabricated from any material that holds the target objects 14 in a dimensionally stable position within the body 12 and does not affect the generation of either the PET emission image data or the MRI image data used to align the multi-modal imaging system 300. Although FIGS. 1-4 illustrate the alignment object 10 as having a substantially spherical shape and a curved lower surface, it should be realized that this shape is exemplary only. The alignment object 10 may have any shape that facilitates aligning the multi-modal imaging system 300.

As shown in FIGS. 1-4, the alignment object 10 also includes the plurality of target objects 14 embedded in the body 12. In the exemplary embodiment, the alignment object 10 includes five target objects 14. Optionally, the alignment object 10 may include more than five target objects 14 to increase the accuracy of the data by providing duplicate target objects 14 within the alignment object 10. In another embodiment, the alignment object 10 may include less than five target objects 14.

The target objects 14 are each located within the body 12 to enhance the imaging system alignment process. Specifically, each target object 14 is located over the field of view of the alignment object 10 along the x-axis, y-axis, and z-axis. For example, referring again to FIGS. 1-4, the target objects 14, in one embodiment, are embedded within the alignment object 10 at predetermined locations that are selected to achieve an optimal measurement between the PET emission data and the MRI data. Accordingly, it should be realized that the target objects 14 may located at different positions within the alignment object 10 based on the tradeoffs of the multi-modality imaging system being aligned. For example, the target objects 14 may be located at different positions within the alignment object 10 when aligning a CT/PET imaging system.

The arrangement of the target objects 14 is explained with respect to the x-axis which extends substantially horizontally through the alignment object 10 from the first side surface 26 to the second side surface 28, the y-axis which extends from the upper surface 22 to the lower surface 24, and the z-axis which extends from the first end 16 to the second end 18. In various embodiments, the alignment object 10 includes a first target object 30 that is disposed along the y-axis and is located proximate to the upper surface 22 of the alignment object 10. A second target object 32 is disposed along the y-axis and is located proximate to the lower surface 24. A third target object 34 is also disposed along the y-axis and is located proximate to the second end 18 and is also disposed between the first target object 30 and the second target object 32. The alignment object 10 also includes a fourth target object 36 that is disposed along the x-axis and is located proximate to the first side 26 and a fifth target object 38 that is also disposed along the x-axis and is located proximate to the second side 28.

Figure 5:
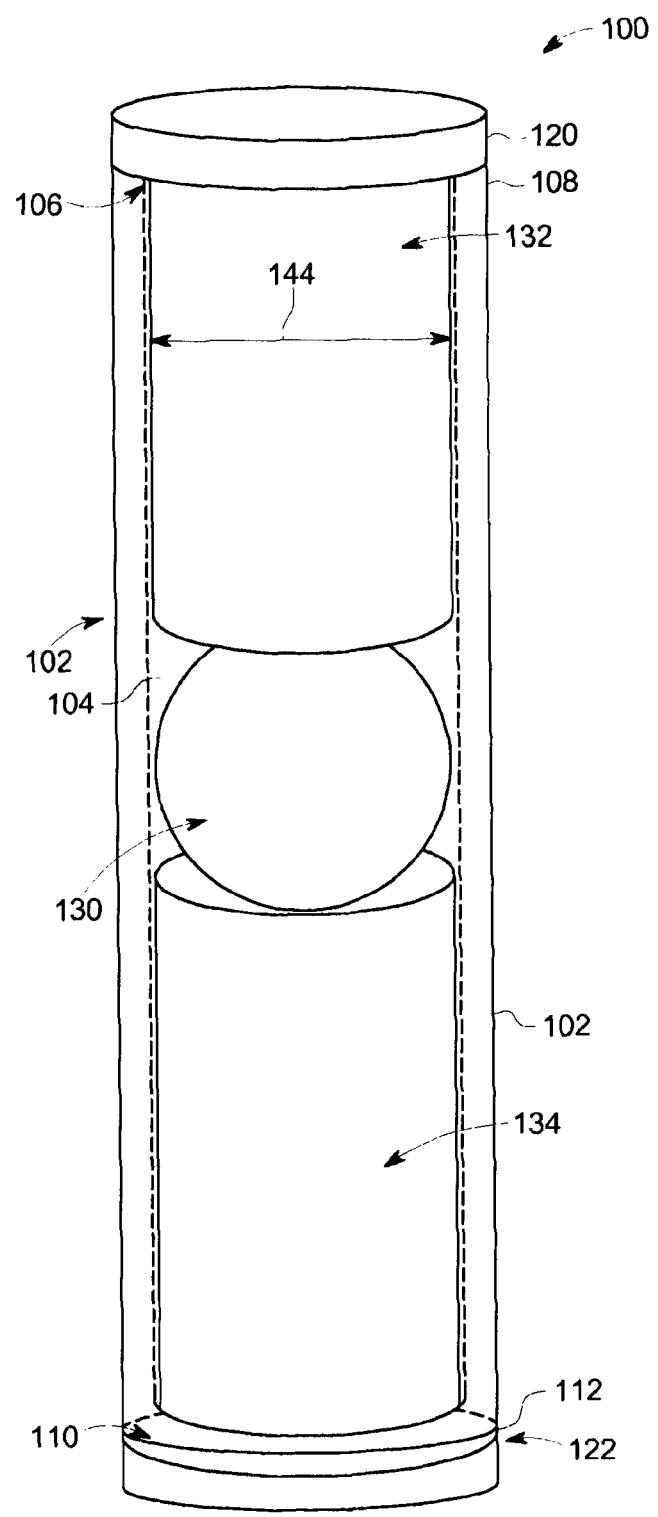
FIG. 5 is a side perspective view of an exemplary target object that may be utilized with the alignment object shown in FIG. 1 formed in accordance with various embodiments.

FIG. 5 is a side perspective view of an exemplary target object 100 that may be utilized with the alignment object 10 shown in FIGS. 1-4. More specifically, the target object 100 may be embodied as any or all of the target objects 14 shown in FIGS. 1-4. In various embodiments, the target object 100 includes a body 102 having a substantially cylindrical shape. Optionally the body 102 may have other shapes, such as for example, triangular, square, or any multi-sided shape. Accordingly, and in the exemplary embodiment, the body 102 is substantially hollow to define a cylindrical cavity 104 therein. In various embodiments, the body 102 has a first opening 106 that is defined at a first end 108 of the body 102 and a second opening 110 that is defined at a second end 112 of the body 102, which are opposite end in this exemplary embodiment.

The target object 100 further includes a first end cap 120 that is configured to be removably coupled to the first end 108 and seal the first opening 106. In operation, the first end cap 120 is configured to form a substantially fluid-tight seal of the first opening 106 such that various imaging sources, discussed in more detail below, that are placed within the target object 100 are sealed within the cavity 104. In other embodiments, the target object 100 may also include a second end cap 122 that is configured to be removably coupled to the second end 112 and seal the second opening 110 such that the various imaging sources that are disposed within the target object 100 are sealed within the cavity 104. In various other embodiments, the target object 100 does not include the second end cap 122. Rather, the second end 112 is formed from a substantially solid material and is fabricated unitarily with the body 102 such that no removable end cap is utilized. More specifically, the body 102 may be fabricated to include only the one opening, i.e., the first opening 106, such that only one end cap, i.e. the end cap 120, is utilized to seal the various imaging sources within the cavity 104.

As described above, the target object 100 is configured to retain a plurality of imaging sources within the cavity 104. More specifically, and in various embodiments, the target object 100 includes at least a first imaging source 130 and a second different imaging source 132. Imaging source, as used herein, is defined as an object that includes an imaging medium that is scannable by the multi-modality imaging system to generate information that is utilized to align the multi-modality imaging system. In various embodiments, the first imaging source 130 is a radioactive imaging source 130 that is scannable by the PET imaging modality to generate PET alignment information. Moreover, the second imaging source 132 is a MR imaging source 132 that is scannable by the MR imaging modality to generate MR alignment information. In various embodiments, and as shown in FIG. 5, the target object 100 also includes a third imaging source 134 that in the exemplary embodiment, is a second emission source 132 that is scannable by the PET imaging system to generate additional PET alignment information. In various embodiments, the first imaging source 130 is disposed between the second and third imaging sources 132 and 134 within the cavity 104.

Figure 6:
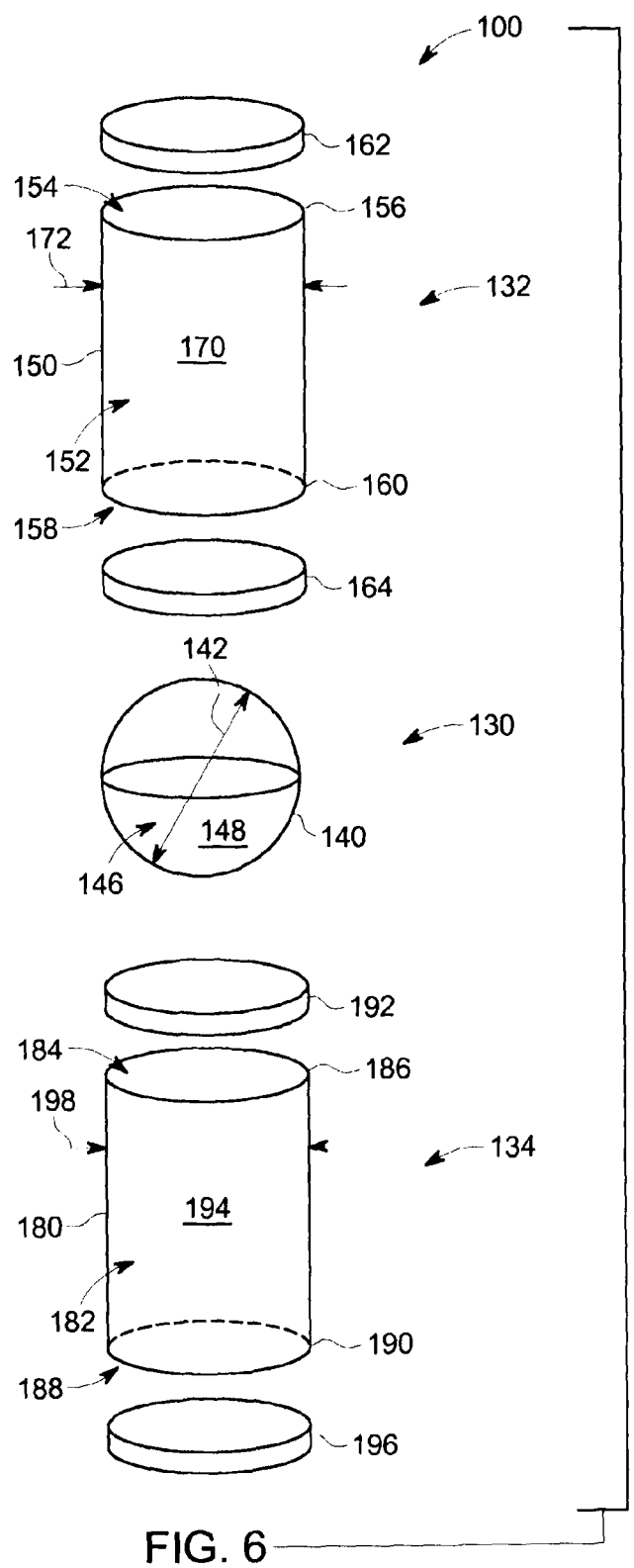
FIG. 6 is an exploded view of the exemplary target object shown in FIG. 5.

FIG. 6 is an exploded view of a portion of the target object 100 shown in FIG. 5. More specifically, FIG. 6 is an exploded view of the first, second and third imaging sources 130, 132 and 134 shown in FIG. 5. Referring again to FIG. 6, the first imaging source 130 has a first shape. In various embodiments, the first imaging source 130 has a spherical shape. More specifically, the first imaging source 130 has a body 140 that is formed as a sphere. The body 140 has an outer diameter 142 that, in the exemplary embodiment, is substantially equal to an inner diameter 144 of the target object body 102 shown in FIG. 5. In various embodiments, the outer diameter 142 of the first imaging source 130 may be slightly less than the inner diameter 144 of the target object cavity 104 to enable the first imaging source 130 to be inserted into the target object cavity 104. Moreover, the outer diameter 142 may be slightly less than the inner diameter 144 to enable the first imaging source 130 to be friction fit within the target object cavity 104 to substantially prevent the first imaging source 130 from moving after being positioned within the target object cavity 104.

The first imaging source body 140 defines a cylindrical or spherical, cavity 146 therein. The body 140 may be fabricated using a plastic material, such as for example, a clear polyvinylchloride material. Optionally, the body 140 may be fabricated from any other material suitable for performing PET imaging. In various embodiments, the first imaging source 130 is filled with a substantially solid radioactive imaging source material 148 that is scannable by the PET imaging modality to generate PET alignment information. In one embodiment, the source material 148 is a germanium isotope, such as for example, Ge-68. Optionally, the source material 148 may be other isotopes utilized to perform PET imaging procedures. Accordingly, the combination of the body 140 and the source material 148 form the substantially solid spherical imaging source 130 that facilitates reducing and/or eliminating any potential source material leakage that may occur if a liquid source material is utilized.

In various embodiments, the second imaging source 132 has a second shape that is different than the shape of the first imaging source 130. In the exemplary embodiment, the second imaging source 132 has a cylindrical shape. The second imaging source 132 includes a body 150 having a substantially cylindrical shape. Optionally the body 150 may have other shapes, such as for example, triangular, square, or any multi-sided shape. In the exemplary embodiment, the shape of the body 150 is substantially the same as the shape of the target object body 102 to enable the second imaging source 132 to be inserted within the target object body 102. Accordingly, the body 150 is substantially hollow to define a cylindrical cavity 152 therein. In various embodiments, the body 150 has a first opening 154 that is defined at a first end 156 of the body 150 and an opposing second opening 158 that is defined at a second end 160 of the body 150.

The second imaging source 132 includes a first end cap 162 that is configured to be removably coupled to the first end 156 to form a substantially fluid-tight seal of the first opening 154. In operation, the first end cap 162 is configured to seal the first opening 154 such that an MR source material 170 is sealed within the cavity 152. In various embodiments, the second imaging source 132 may also include a second end cap 164 that is configured to be removably coupled to the second end 160 and seal the second opening 158 such that the source material 170 is sealed within the cavity 152. In various other embodiments, the second imaging source 132 does not include the second end cap 164. Rather, the second end 160 is formed from a substantially solid material and is fabricated unitarily with the body 150 such that no removable end cap is utilized. More specifically, the body 150 may be fabricated to include only the one opening, i.e., the first opening 154 such that only one end cap, i.e. the end cap 162 is utilized to seal the source material 170 within the cavity 152.

The body 150 has an outer diameter 172 that, in the illustrated embodiment, is substantially equal to the inner diameter 144 of the target object body 102 shown in FIG. 5. More specifically, the outer diameter 172 of the second imaging source 132 may be slightly less than the inner diameter 144 of the target object cavity 104 to enable the second imaging source 132 to be inserted into the target object cavity 104. Moreover, the outer diameter 142 may be slightly less than the inner diameter 144 to enable the second imaging source 132 to be friction fit within the target object cavity 104 to substantially prevent the second imaging source 132 from moving after being positioned within the target object cavity 104.

In use, the opening 154 or the opening 158 may be utilized by a user to access the interior volume 152 of the second imaging source 132 to facilitate filling the cavity 152 with the MR source material 170. In the exemplary embodiment, the MR source material 170 is a liquid MR-visible contrast medium. Accordingly, the body 150 forms the hollow cavity 152 that is configured to store the MR contrast medium 170. Moreover, once the MR contrast medium 170 is disposed within the cavity 152, the lid 162 may be secured to the body 150 to substantially seal the MR contrast medium 170 within the cavity 152. Moreover, the removable lid 162 enables the user to remove the MR contrast medium 170 and replace the MR contrast medium with a different source material to align different MR imaging systems or other imaging modalities.

As described above, and in various embodiments, the target object 100 may also include the third imaging source 134. The third imaging source 134 also has a shape that is substantially the same as the shape of the second imaging source 132 and thus is different than the shape of the first imaging source 130. In the exemplary embodiment, the third imaging source 134 has a cylindrical shape. The third imaging source 134 includes a body 180 having a substantially cylindrical shape. Optionally the body 180 may have other shapes, such as for example, triangular, square, or any multi-sided shape. In the exemplary embodiment, the shape of the body 180 is substantially the same as the shape of the target object body 102 to enable the third imaging source 134 to be inserted within the target object body 102. Accordingly, and in the exemplary embodiment, the body 180 is substantially hollow to define a cylindrical cavity 182 therein.

In various embodiments, the body 180 has a first opening 184 that is defined at a first end 186 of the body 180 and an opposing second opening 188 that is defined at a second end 190 of the body 180. The third imaging source 134 also includes a first end cap 192 that is configured to be removably coupled to the first end 186 and seal the first opening 184. In operation, the first end cap 192 is configured to seal the first opening 184 such that a MR source material 194 is sealed within the cavity 182. In various embodiments, the MR source material 194 is the same as the MR source material 170 in the second imaging source 132. In other embodiments, the MR source material 194 may be different than the MR source material 170. In various embodiments, the third imaging source 134 may also include a second end cap 196 that is configured to be removably coupled to the second end 190 and seal the second opening 188 such that the source material 194 is sealed within the cavity 182. In various other embodiments, the third imaging source 134 does not include the second end cap 196. Rather, the second end 190 is formed from a substantially solid material and is fabricated unitarily with the body 180 such that no removable end cap is utilized. More specifically, the body 180 may be fabricated to include only the one opening, i.e., the first opening 184 such that only one end cap, i.e. the end cap 192 is utilized to seal the source material 194 within the cavity 182.

The body 180 has an outer diameter 198 that, in the exemplary embodiment, is substantially equal to the inner diameter 144 of the target object body 102 shown in FIG. 5. More specifically, the outer diameter 198 of the third imaging source 134 may be slightly less than the inner diameter 144 of the target object cavity 104 to enable the third imaging source 134 to be inserted into the target object cavity 104. Moreover, the outer diameter 198 may be slightly less than the inner diameter 144 to enable the third imaging source 134 to be friction fit within the target object cavity 104 to substantially prevent the third imaging source 134 from moving after being positioned within the target object cavity 104.

In use, the opening 184 or the opening 188 may be utilized by a user to access the cavity 182 of the third imaging source 134 to facilitate filling the cavity 182 with the MR source material 194. In the exemplary embodiment, the MR source material 194 is also a liquid MR-visible contrast medium. Accordingly, the body 180 forms the hollow cavity 182 that is configured to store the MR contrast medium 194. Moreover, once the MR contrast medium 194 is disposed within the cavity 182, the lid 192 may be secured to the body 180 to substantially seal the MR contrast medium 194 within the cavity 182. Moreover, the removable lid 192 enables the user to remove the MR contrast medium 194 and replace the MR contrast medium with a different source material to align different MR imaging systems or other imaging modalities.

Figure 7:
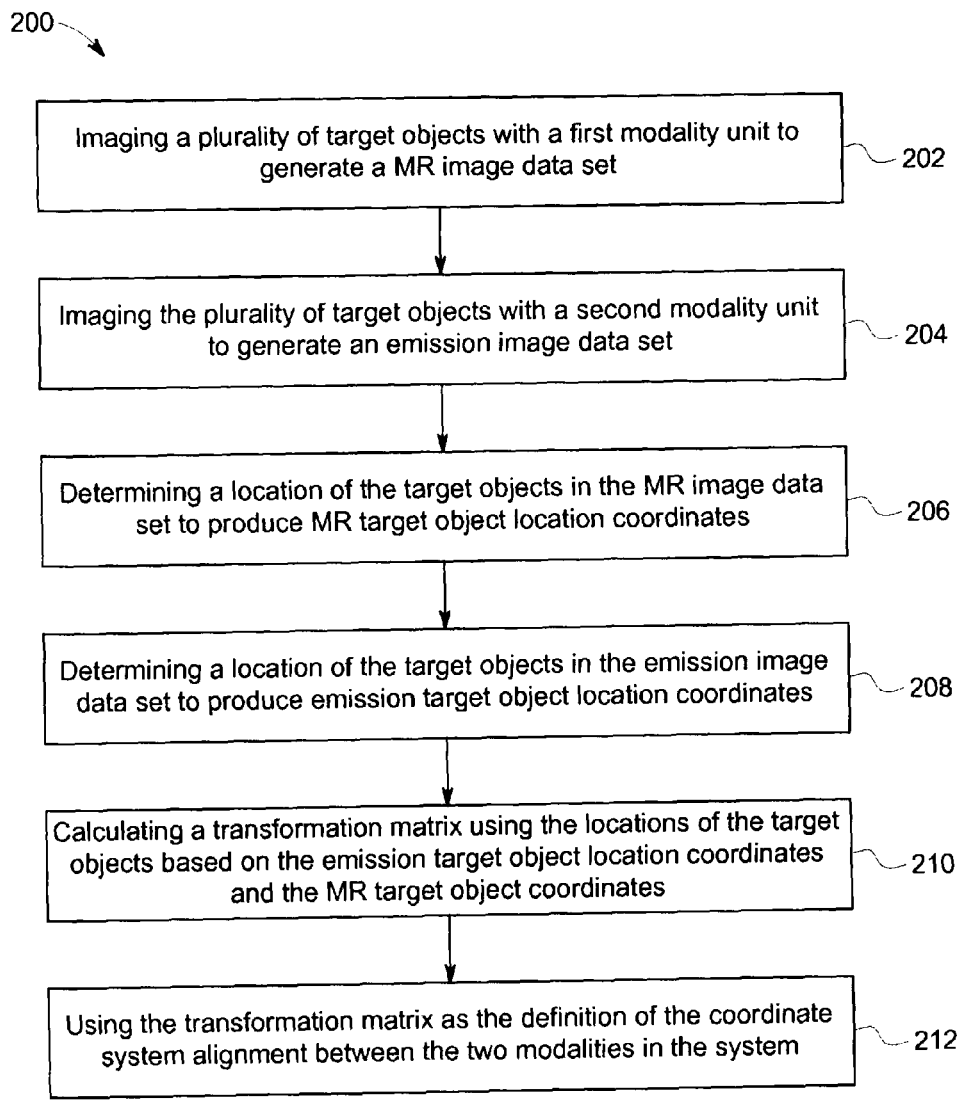
FIG. 7 is a flowchart of an exemplary method of aligning a multi-modality imaging system.
Figure 8:
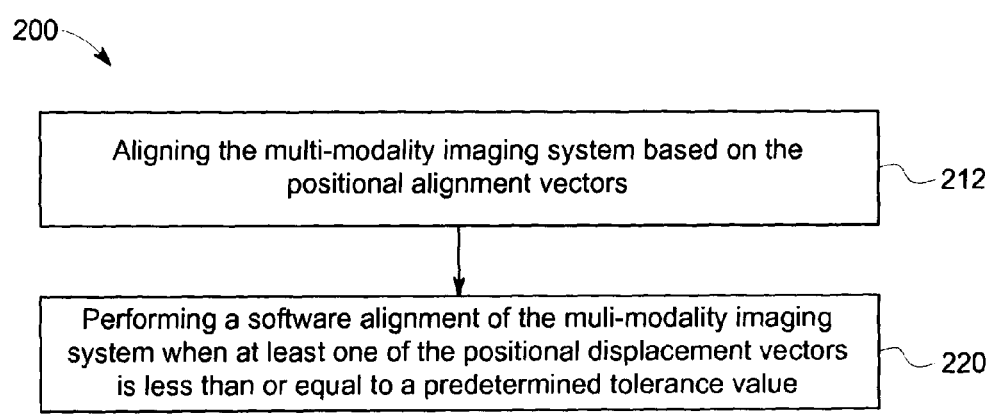
FIG. 8 is a flowchart of a portion of the method shown in FIG. 7.

FIG. 7 is a flow chart illustrating an exemplary method 200 of determining component misalignment in a multi-modality imaging system including a first modality unit and a second modality unit. FIG. 8 is a flowchart illustrating detailed portions of the method 200 shown in FIG. 7. As shown in FIG. 7, the method 200 includes imaging at 202 the plurality of target objects 14 with the first modality unit 302 to generate an MR image data set and imaging at 204 the plurality of target objects 14 with the second modality unit 304 to generate an emission image data set. A location of the target objects 14 is then determined at 206 in the MR image data set and also determined at 208 in the emission image data set to produce emission target object location coordinates and MR target object locations. The method 200 also includes calculating at 210 a transformation matrix using the locations of the target objects 14 based on the emission target object location coordinates and the MR target object coordinates, and using at 212, the transformation matrix as the definition of the coordinate system alignment between the two modalities in the system. The transformation serves as the mechanism to align images from one system to the other.

Referring to FIG. 8, the aligning at 212 of the multi-modality imaging system 300 based on the positional alignment vectors includes performing at 220 a software alignment of the multi-modality imaging system 300 when at least one of the positional displacement vectors is greater than or equal to the predetermined tolerance value. In the exemplary embodiment, the predetermined tolerance value, may be for example, greater than approximately five millimeters.

To perform the method 200, the alignment object 10 is positioned within the multi-modality imaging system 300 (shown in FIG. 9). In various embodiments, the portion of the multi-modality imaging system 300 that lies generally outside the field of view (FOV) of the alignment object 10 may be masked to reduce noise in the generated image data sets.

Figure 10:
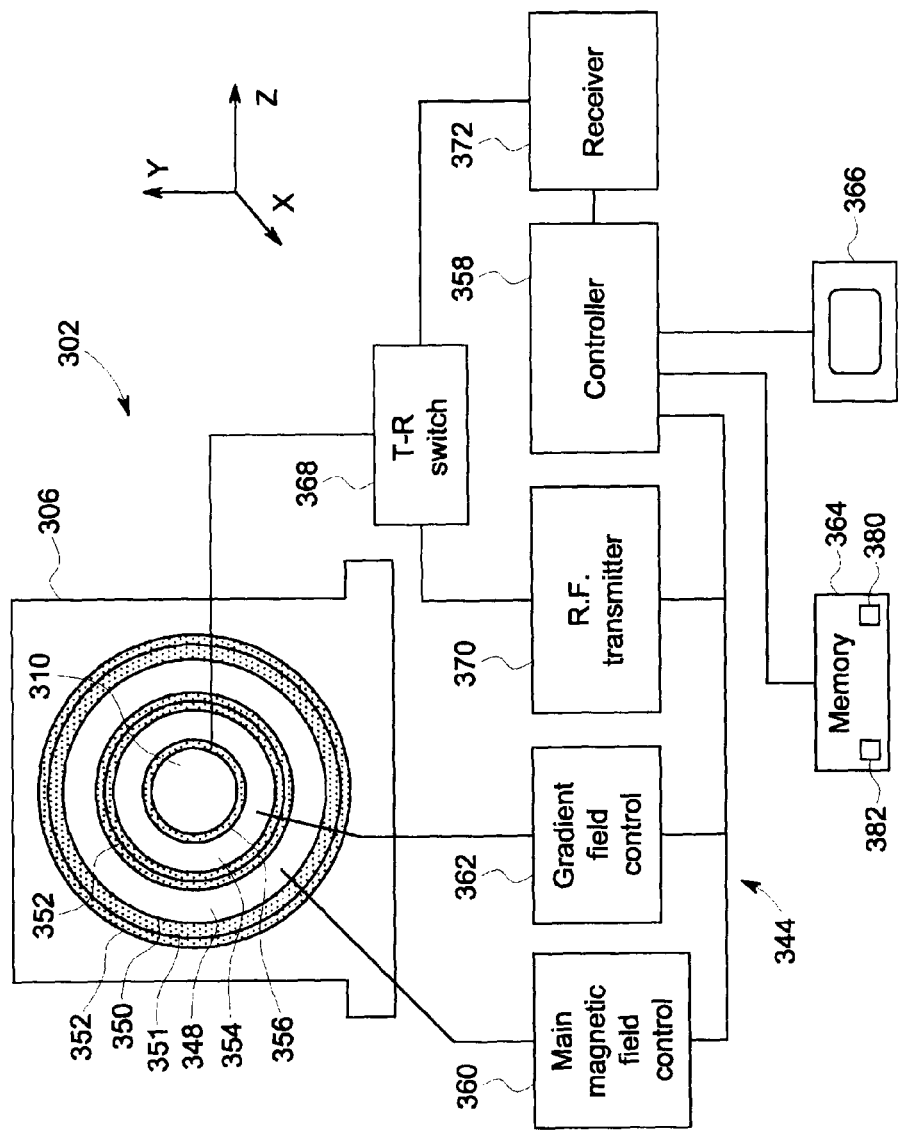
FIG. 10 is a block diagram of a portion of the exemplary imaging system shown in FIG. 9 formed in accordance with various embodiments.

The alignment object 10 is then scanned using the MR imaging system 302 to generate the MR image data set 380 (shown in FIG. 10). The alignment object 10 is also scanned with the PET imaging system 304 (shown in FIG. 9) to generate an emission image data set 382 (shown in FIG. 10) which may both form part of the same multi-modality imaging system 300. A location of the target objects 14 in the MR image data set is determined. A location of the target objects 14 is also determined in the emission image data set. In the exemplary embodiment, the alignment object 10 includes five target objects 14. The location or position of the five target objects 14 in the MR image data set is determined at 206 to generate the MR target object location coordinates. The location or position of the same five target objects 14 in the emission image data set is determined at 208 to generate the emission target object location coordinates. A single emission target object coordinate represents a location of a single target object 14 in 3D space in the emission image data set. Moreover, a single MR target object coordinate represents a location of the same target in 3D space in the MR image data set. In the exemplary embodiment, assuming five target objects 14 are imaged, method 200 includes determining a location of the five target objects 14 in the emission image data set and producing a single object location coordinate for each target object 14 in the emission image data set. Additionally, method 200 includes determining a location of the five target objects in the MR image data set and producing a single object location coordinate for each target object in the MR image data set.

The location of the features within the emission image data set is then determined. The location of the same features within the MR image data is also determined. A transformation is then determined based upon the offset (x,y,z) and rotation ($\alpha$, $\beta$, $\gamma$) as determined from the difference in locations of the same features within the two image sets. A set of positional displacement vectors represent the spatial difference of the target objects 14 in three-dimensional space between the target object 14 located in the emission image data set and the same target object 14 located in the MR image data set. For example, calculating at 210 a positional alignment vector for each target object 14 based on the emission target object location coordinates and the MR data target object location coordinates. In the exemplary embodiment, the positional alignment vector is calculated by determining the special location difference by subtracting an emission object location coordinates from the respective MR object locations coordinates, for example, to generate a single positional displacement vector for each target object 14 observed in both the emission image data set and the MR image data set.

In the exemplary embodiment, since the alignment object 10 includes five target objects 14, five positional displacement vectors, one for each target object 14 is calculated. The positional displacement vectors are then used to calculate a misalignment of the imaging table 312 relative to the PET imaging system 304 or the MR imaging system 302, and/or to calculate a misalignment between the PET imaging system 304 and the MR imaging system 302.

In one embodiment, if at least one of the calculated positional displacement vectors is greater than a predetermined tolerance value, the method 200 includes performing at 220 the software alignment. It should be realized that predetermined tolerance value is exemplary only and may be either increased or decreased based on the sensitivity of the imaging systems being aligned. For example, a software alignment may be performed when the predetermined tolerance value is equal to ten, i.e. the displacement in 3D space between a target object 14 located in the emission image data set is less than ten millimeters from the same target object 14 located in the MR image data set. The predetermined tolerance value may be selected between a range of approximately 3 millimeters and approximately 15 millimeters.

To perform the software alignment, the positional displacement vectors are stored in a computer, such as the computer 320 shown in FIG. 9, for example, of the multi-modality imaging system 300. During patient scanning, if the patient is scanned with both the PET imaging system 304 and the MR imaging system 302, the computer 320 utilizes the positional displacement vectors to properly align the emission image data set with the MR image data set during the registration process.

Optionally, if at least one of the calculated positional displacement vectors is greater than the predetermined tolerance value, a hardware or mechanical alignment may be performed, such as, for example, the mechanical alignment procedure described in U.S. Pat. No. 7,103,233 which is commonly owned.

The software and/or mechanical alignment inform a user or an installer of the system 300 as to a table alignment status (i.e., whether or not the table is misaligned with either the first modality unit 302 or the second modality unit 304, or more typically, both units because the units are substantially aligned to each other). Specifically, both the $\alpha_T$ and $\beta_T$ parameters are utilized to align the imaging table 312, and the other six parameters are used to align the PET unit 304 with the MM unit 302. The installer can then re-align the table (adjust the axis of the table) with the gantry of the imaging system and repeat the herein described methods to verify if the re-aligned system is misaligned or not. Additionally, as discussed above, the installer may perform a software alignment after the above described hardware alignment is completed. For example, the PET gantry roll can be corrected in the reconstruction software.

There is therefore provided efficient and cost effective methods and apparatus for determining component misalignment in multi-modal imaging systems. The herein described methods utilize both the PET emission data and the MR image data to generate the positional displacement vectors. The positional displacement vectors are the utilized to calculate various table alignment parameters, such as the $\alpha_T$ and $\beta_T$ parameters while simultaneously determining gantry alignment through parameters $P_x$, $P_y$, $P_z$, $\alpha_P$, $\beta_P$, and $\gamma_P$. More specifically, the alignment object 10 described herein may be utilized to align a multi-modality imaging system, such as the imaging system 300 shown in FIG. 9. The alignment object 10 is simple and robust. At least some of the imaging sources within the alignment object 10 may be filled or refilled with an MR contrast agent that is tailored to a specific MR system. Moreover, in some embodiments, at least one imaging source is solid such that the imaging source does not leak. Accordingly, the alignment object 10 may be readily extended and customized to differing MR configurations.

Figure 11:
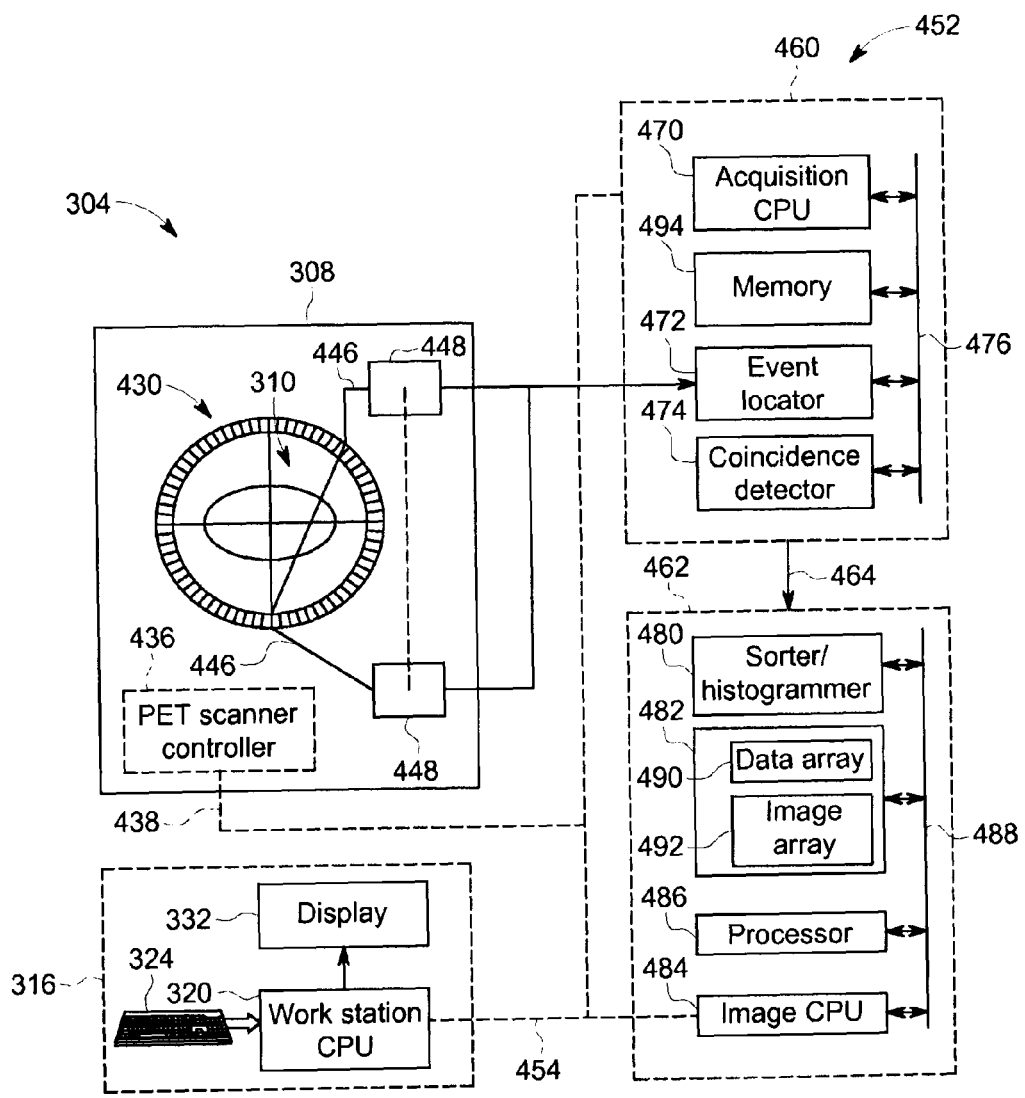
FIG. 11 is a block diagram of another portion of the exemplary imaging system shown in FIG. 9 formed in accordance with various embodiments.

In various embodiments, the alignment object 10 and the methods described herein may be implemented with a multi-modality imaging system. For example, FIGS. 9, 10, and 11 illustrate embodiments of a multi-modality imaging system 300 that may be aligned using the method 200 and the alignment object 10. The multi-modality imaging system 300 may be any type imaging system, for example, different types of medical imaging systems, which in various embodiments, is an MRI system in combination with one of, for example, a PET system or a SPECT system capable of generating diagnostic images. Moreover, the various embodiments are not limited to medical imaging systems for imaging human subjects, but may include veterinary or non-medical systems for imaging non-human objects, etc., as well as non-imaging applications, such as radiation therapy.

Referring to FIG. 9, the multi-modality imaging system 300 includes a first modality unit 302 and a second modality unit 304. The two modality units enable the multi-modality imaging system 300 to scan an object or patient 305 in a first modality using the first modality unit 302, which in this embodiment is MR and to scan the patient 305 in a second modality using the second modality unit 304, which in this embodiment is PET. The multi-modality imaging system 300 allows for multiple scans in different modalities to facilitate an increased diagnostic capability over single modality systems. In one embodiment, the multi-modality imaging system 300 is an MR/PET imaging system and in another embodiment the multi-modality imaging system 300 is an MR/SPECT imaging system.

The imaging system 300 is shown as including a gantry 306 that is associated with the first modality unit 302, which is an MR scanner, and a gantry 308 that is associated with the second modality unit 304 which is the PET scanner. During operation, the patient 305 is positioned within a central opening 310, defined through the imaging system 300, using, for example, a motorized table 312.

The gantry 306 includes MR imaging components, for example, one or more magnets as described in more detail herein. The gantry 308 includes imaging components for example, at least one gamma detector or camera. The imaging system 300 also includes an operator workstation 316. During operation, the motorized table 312 moves the patient 305 into the central opening 310 of the gantry 306 and/or 308 in response to one or more commands received from the operator workstation 316. The workstation 316 then operates the first and second modality units 302 and 304 to, for example, both scan the patient 305 in MR and acquire MR data and/or acquire emission data of the patient 305. The workstation 316 may be embodied as a personal computer (PC) that is positioned near the imaging system 300 and hard-wired to the imaging system 300 via a communication link 318. The workstation 316 may also be embodied as a portable computer such as a laptop computer or a hand-held computer that transmits information to, and receives information from, the imaging system 300. Optionally, the communication link 318 may be a wireless communication link that enables information to be transmitted to or from the workstation 316 to the imaging system 300 wirelessly. In operation, the workstation 316 is configured to control the operation of the imaging system 300 in real-time. The workstation 316 is also programmed to perform medical image diagnostic acquisition and reconstruction processes described herein.

The operator workstation 316 includes a central processing unit (CPU) or computer 320, a display 322, and an input device 324. In the exemplary embodiment, the computer 320 executes a set of instructions that are stored in one or more storage elements or memories, in order to process information received from the first and second modality units 302 and 304. For example, in various embodiments, the computer 316 may include a set of instructions to implement the method 100 described herein. The storage elements may also store data or other information as desired or needed. The storage element may be in the form of an information source or a physical memory element located within the computer 320. The set of instructions may include various commands that instruct the computer 320 as a processing machine to perform specific operations such as the methods and processes of the various embodiments described herein.

The computer 320 connects to the communication link 318 and receives inputs, e.g., user commands, from the input device 324. The input device 324 may be, for example, a keyboard, mouse, a touch-screen panel, and/or a voice recognition system, etc. Through the input device 324 and associated control panel switches, the operator can control the operation of the first and second modality units 302 and 304 and the positioning of the patient 305 for a scan. Similarly, the operator can control the display of the resulting image on the display 322.

Referring to FIG. 10, the imaging system 300 includes the imaging portion 302 and a processing portion 344 that may also include a processor or other computing or controller device, such as illustrated in FIG. 9. The imaging system 300 includes within a helium vessel 351 a superconducting magnet 348 formed from coils, which may be supported on a magnet coil support structure. The helium vessel 351 surrounds the superconducting magnet 348 and is filled with liquid helium.

Thermal insulation 352 is provided surrounding all or a portion of the outer surface of the helium vessel 351. A plurality of magnetic gradient coils 354, such as the x, y, and z gradient coils described above, are provided inside the superconducting magnet 348 and an RF transmit coil 356 is provided within the plurality of magnetic gradient coils 354. In some embodiments, the RF transmit coil 356 may be replaced with a transmit and receive coil. The components within the gantry 306 generally form the imaging portion 302. It should be noted that although the superconducting magnet 348 is a cylindrical shape, other shapes of magnets can be used.

The processing portion 344 generally includes a controller 358, a main magnetic field control 360, a gradient field control 362, a memory 364, a display device, embodied as the monitor 366, a transmit-receive (T-R) switch 368, an RF transmitter 370 and a receiver 372.

In operation, a body of an object, such as a patient or a phantom to be imaged, is placed in the bore 310 on a suitable support, for example, a patient table. The superconducting magnet 348 produces a uniform and static main magnetic field $B_o$ across the bore 310. The strength of the electromagnetic field in the bore 310 and correspondingly in the patient, is controlled by the controller 358 via the main magnetic field control 360, which also controls a supply of energizing current to the superconducting magnet 348.

The magnetic gradient coils 354, which include one or more gradient coil elements, are provided so that a magnetic gradient can be imposed on the magnetic field $B_o$ in the bore 310 within the superconducting magnet 348 in any one or more of three orthogonal directions x, y, and z. The magnetic gradient coils 354 are energized by the gradient field control 362 and are also controlled by the controller 358.

The RF transmit coil 356, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 356.

The RF transmit coil 356 and the receive surface coil are selectably interconnected to one of the RF transmitter 370 or receiver 372, respectively, by the T-R switch 368. The RF transmitter 370 and T-R switch 368 are controlled by the controller 358 such that RF field pulses or signals are generated by the RF transmitter 370 and selectively applied to the patient for excitation of magnetic resonance in the patient. While the RF excitation pulses are being applied to the patient, the T-R switch 368 is also actuated to disconnect the receive surface coil from the receiver 372.

Following application of the RF pulses, the T-R switch 368 is again actuated to disconnect the RF transmit coil 356 from the RF transmitter 370 and to connect the receive surface coil to the receiver 372. The receive surface coil operates to detect or sense the MR signals resulting from the excited nuclei in the patient and communicates the MR signals to the receiver 372. These detected MR signals are in turn communicated to the controller 358. The controller 358 includes a processor (e.g., image reconstruction processor), for example, that controls the processing of the MR signals to produce signals representative of an image of the patient.

The processed signals representative of the image are also transmitted to the monitor 366 to provide a visual display of the image. Specifically, the MR signals fill or form a k-space that is Fourier transformed to obtain a viewable image. The processed signals representative of the image are then transmitted to the monitor 366.

FIG. 11 is a diagram of an exemplary PET imaging system 400 that may form one of the modalities of the multi-modality imaging system 300 described above. More specifically, the second modality unit 304 may be the PET imaging system 400. The PET imaging system 400 includes a detector ring assembly 430 including a plurality of detector scintillators. The detector ring assembly 430 includes the central opening 410, in which an object or patient, such as the patient 305 may be positioned, using, for example, the motorized table. The scanning operation is controlled from the operator workstation 416 through a PET scanner controller 436. A communication link 438 may be hardwired between the PET scanner controller 436 and the workstation 416. Optionally, the communication link 438 may be a wireless communication link that enables information to be transmitted to or from the workstation 416 to the PET scanner controller 436 wirelessly.

In the exemplary embodiment, the workstation 416 controls real-time operation of the PET imaging system 400. The workstation 416 is also programmed to perform medical image diagnostic acquisition and reconstruction processes described herein. The operator workstation 416 includes the central processing unit (CPU) or computer 420, the display 422 and the input device 424. As used herein, the term "computer" may include any processor-based or microprocessor-based system configured to execute the methods described herein.

The methods described herein may be implemented as a set of instructions that include various commands that instruct the computer or processor 420 as a processing machine to perform specific operations such as the methods and processes of the various embodiments described herein.

During operation of the exemplary detector 430, when a photon collides with a scintillator on the detector ring assembly 430, the absorption of the photon within the detector produces scintillation photons within the scintillator. The scintillator produces an analog signal that is transmitted on a communication link 446 when a scintillation event occurs. A set of acquisition circuits 448 is provided to receive these analog signals. The acquisition circuits 448 produce digital signals indicating the 3-dimensional (3D) location and total energy of each event. The acquisition circuits 448 also produce an event detection pulse, which indicates the time or moment the scintillation event occurred.

The digital signals are transmitted through a communication link, for example, a cable, to a data acquisition controller 452 that communicates with the workstation 416 and the PET scanner controller 436 via a communication link 454. In one embodiment, the data acquisition controller 452 includes a data acquisition processor 460 and an image reconstruction processor 462 that are interconnected via a communication link 464. During operation, the acquisition circuits 448 transmit the digital signals to the data acquisition processor 460. The data acquisition processor 460 then performs various image enhancing techniques on the digital signals and transmits the enhanced or corrected digital signals to the image reconstruction processor 462 as discussed in more detail below.

In the exemplary embodiment, the data acquisition processor 460 includes at least an acquisition CPU or computer 470. The data acquisition processor 460 also includes an event locator circuit 472 and a coincidence detector 474. The acquisition CPU 470 controls communications on a back-plane bus 476 and on the communication link 464. During operation, the data acquisition processor 460 periodically samples the digital signals produced by the acquisition circuits 448. The digital signals produced by the acquisition circuits 448 are transmitted to the event locator circuit 472. The event locator circuit 472 processes the information to identify each valid event and provide a set of digital numbers or values indicative of the identified event. For example, this information indicates when the event took place and the position of the scintillator that detected the event. The events are also counted to form a record of the single channel events recorded by each detector element. An event data packet is communicated to the coincidence detector 474 through the back-plane bus 476.

The coincidence detector 474 receives the event data packets from the event locator circuit 472 and determines if any two of the detected events are in coincidence. Coincident event pairs are located and recorded as a coincidence data packets by the coincidence detector 474. The output from the coincidence detector 474 is referred to herein as image data. In one embodiment, the image data may be stored in a memory device that is located in the data acquisition processor 460. Optionally, the image data may be stored in the workstation 416.

The image data subset is then transmitted to a sorter/histogrammer 480 to generate a data structure known as a histogram. The image reconstruction processor 462 also includes a memory module 482, an image CPU 484, an array processor 486, and a communication bus 488. During operation, the sorter/histogrammer 480 performs the motion related histogramming described above to generate the events listed in the image data into 3D data. This 3D data, or sinograms, is organized in one exemplary embodiment as a data array 490. The data array 490 is stored in the memory module 482. The communication bus 488 is linked to the communication link 476 through the image CPU 484. The image CPU 484 controls communication through communication bus 488. The array processor 486 is also connected to the communication bus 488. The array processor 486 receives the data array 490 as an input and reconstructs images in the form of image arrays 492. Resulting image arrays 492 are then stored in the memory module 482. The images stored in the image array 492 are communicated by the image CPU 484 to the operator workstation 416. In the illustrated embodiment, the PET imaging system 400 also includes a memory 494 that may be utilized to store a set of instructions to implement the various methods described herein.

The various embodiments and/or components, for example, the modules, or components and controllers therein, such as of the imaging system 400, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" may include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A target object for aligning a multi-modality imaging system having emission detectors and magnetic resonance imaging (MRI) detectors, the target object comprising:
    a target object body having a cavity therein;
    a first imaging source being disposed within the cavity, the first imaging source including an imaging source body having a cavity defined therein and a radioactive imaging material disposed within the first imaging source cavity, the radioactive imaging material configured to emit radiation scannable by the emission detectors, the first imaging source having a first shape; and
    a second imaging source being disposed within the cavity, the second imaging source including a body having a cavity defined therein and a magnetic resonance visible material disposed within the cavity of the second imaging source, the magnetic resonance visible material configured to be detected by the MRI detectors, the second imaging source having a second shape that is different than the first shape.

2. The target object of claim 1, wherein the target object body comprises a cylinder and the first imaging source body comprises a sphere.

3. The target object of claim 1, wherein the radioactive imaging material comprises a solid material and the magnetic resonance visible material comprises a liquid material.

4. The target object of claim 1, wherein the target object body comprises a cylinder and the second imaging source body comprises a cylinder.

5. The target object of claim 1, further comprising a third imaging source being disposed within the cavity of the target object body, the third imaging source having a third shape that is different than the first shape and including a magnetic resonance visible material.

6. The target object of claim 5, wherein the first imaging source is disposed between the second and third imaging sources.

7. The target object of claim 1, wherein the first imaging source has an outer diameter that is substantially equal to an inner diameter of the target object body.

8. The target object of claim 1, wherein the first imaging source has an outer diameter that is substantially equal to an outer diameter of the second imaging source.

9. The target object of claim 1, wherein the second imaging source further comprises a removable end cap to access the second imaging source cavity.

10. An alignment object for aligning a multi-modality imaging system having emission detectors and magnetic resonance imaging (MRI) detectors, the alignment object comprising:
    a target object body having a cavity therein; and
    a plurality of target objects installed in the target object body, at least one of the target objects including
        a first imaging source being disposed within the cavity of the target object body, the first imaging source including a body having a cavity defined therein and a radioactive imaging material disposed within the cavity of the first imaging source, the radioactive imaging material configured to emit radiation scannable by the emission detectors, the first imaging source having a first shape; and
        a second imaging source being disposed within the cavity of the target object body, the second imaging source including a body having a cavity defined therein and a magnetic resonance visible material disposed within the cavity of the second imaging source, the magnetic resonance visible material configured to be detected by the MRI detectors, the second imaging source having a second shape that is different than the first shape.

11. The alignment object of claim 10, wherein the target object body comprises a cylinder and the body of the first imaging source comprises a sphere.

12. The alignment object of claim 10, wherein the radioactive imaging material comprises a solid material and the magnetic resonance response material comprises a liquid material.

13. The alignment object of claim 10, wherein the target object body comprises a cylinder and the body of the second imaging source comprises a cylinder.

14. The alignment object of claim 10, further comprising a third imaging source being disposed within the cavity of the target object body, the third imaging source having a third shape that is different than the first shape and including a magnetic resonance visible material.

15. The alignment object of claim 14, wherein the first imaging source is disposed between the second and third imaging sources.

16. The alignment object of claim 10, wherein the first imaging source has an outer diameter that is substantially equal to an inner diameter of the target object body.

17. The alignment object of claim 10, wherein the first imaging source has an outer diameter that is substantially equal to an outer diameter of the second imaging source.

18. A method of aligning a multi-modality imaging system including a first modality unit having emission detectors, and a second modality unit having magnetic resonance imaging (MRI) detectors, said method comprising:
   imaging a plurality of target objects with the first modality unit to generate an emission image data set, wherein at least one of the target objects includes
      a target object body having a cavity therein;
      a first imaging source being disposed within the cavity of the target object body, the first imaging source including a body having a cavity defined therein and a radioactive imaging material disposed within the cavity of the first imaging source, the radioactive imaging material configured to emit radiation to be detected by the emission detectors, the first imaging source having a first shape; and
      a second imaging source being disposed within the cavity of the target object, the second imaging source including a body having a cavity defined therein and a magnetic resonance visible material disposed within the cavity of the second imaging source, the magnetic resonance visible material configured to be detected by the MRI detectors, the second imaging source having a second shape that is different than the first shape;
   determining a location of the target objects in the emission image data set to produce emission target object location coordinates;
   calculating a positional alignment vector for each target object based on the emission target object location coordinates; and
   aligning the multi-modality imaging system based on the positional alignment vectors.

19. The method of claim 18, further comprising:
   imaging the plurality of target objects with the second modality unit to generate a magnetic resonance (MR) image data set;
   determining a location of the target objects in the MR image data set to produce MR target object location coordinates; and
   calculating a positional alignment vector for each target object based on the emission target object location coordinates and the MR target object location coordinates.

20. The method of claim 19, further comprising registering the emission image data set with the MR image data set to calculate a positional alignment vector for each target object.

* * * * *